(12) United States Patent
Zhang et al.

(10) Patent No.: US 11,380,236 B2
(45) Date of Patent: Jul. 5, 2022

(54) SUB-PIXEL ARRANGEMENT STRUCTURE, MASK DEVICE, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Yuanqi Zhang, Beijing (CN); Fengli Ji, Beijing (CN); Peng Xu, Beijing (CN); Sen Du, Beijing (CN)

(73) Assignees: BOE Technology Group Co., LTD., Beijing (CN); Chengdu BOE Optoelectronics Technology Co., LTD., Sichuan (CN)

( * ) Notice: Subject to any disclaimer, the term of this patent is extended or adjusted under 35 U.S.C. 154(b) by 0 days.

(21) Appl. No.: 16/642,425

(22) PCT Filed: Jul. 26, 2019

(86) PCT No.: PCT/CN2019/097880
§ 371 (c)(1),
(2) Date: Feb. 27, 2020

(87) PCT Pub. No.: WO2020/020337
PCT Pub. Date: Jan. 30, 2020

(65) Prior Publication Data
US 2020/0258441 A1 Aug. 13, 2020

(30) Foreign Application Priority Data
Jul. 27, 2018 (CN) .......................... 201810844277.0

(51) Int. Cl.
*G09G 3/20* (2006.01)
*H01L 27/32* (2006.01)
*H01L 51/56* (2006.01)

(52) U.S. Cl.
CPC ....... *G09G 3/2003* (2013.01); *H01L 27/3213* (2013.01); *H01L 27/3218* (2013.01); *H01L 51/56* (2013.01); *G09G 2300/0452* (2013.01)

(58) Field of Classification Search
CPC .............. G09G 3/2003; H01L 27/3213; H01L 27/3218; H01L 51/56
(Continued)

(56) References Cited

U.S. PATENT DOCUMENTS 10,680,041 B2 * 6/2020 Li ........................ H01L 27/3216
10,748,972 B2 * 8/2020 Chen .................... H01L 27/3246
(Continued)

FOREIGN PATENT DOCUMENTS

| CN | 103714751 A | 4/2014 |
| CN | 106486513 A | 3/2017 |
| CN | 109037287 A | 12/2018 |

OTHER PUBLICATIONS

International search report of PCT application No. PCT/CN2019/097880 dated Oct. 31, 2019.
(Continued)

*Primary Examiner* — Prabodh M Dharia
(74) *Attorney, Agent, or Firm* — Fay Sharpe LLP

(57) ABSTRACT

A sub-pixel arrangement structure, a mask device, and a display device are provided. The sub-pixel arrangement structure includes: a reference sub-pixel array, a plurality of third sub-pixels, and a plurality of fourth sub-pixels. In the reference sub-pixel array, each row of sub-pixels or each column of sub-pixels includes: first sub-pixels and second sub-pixels, both of which are arranged alternately; in either or both of first and second directions of the sub-pixels in the reference sub-pixel array, one of the third sub-pixels is arranged between any two adjacent sub-pixels in the reference sub-pixel array; and one of the fourth sub-pixels is
(Continued)

arranged among any four adjacent sub-pixels in the reference sub-pixel array, and a center of the one of the fourth sub-pixels is located between two rows of sub-pixels of the four sub-pixels arranged in two rows and two column.

20 Claims, 11 Drawing Sheets

(58) Field of Classification Search
USPC .......................................................... 345/694
See application file for complete search history.

(56) References Cited

U.S. PATENT DOCUMENTS

| | | | |
|---|---|---|---|
| 10,854,684 B2* | 12/2020 | Huangfu | G09G 3/3233 |
| 10,909,901 B2* | 2/2021 | Wu | H01L 27/3218 |
| 10,991,768 B2* | 4/2021 | Li | H01L 27/3216 |
| 11,024,688 B2* | 6/2021 | Lu | G09G 3/20 |
| 2015/0091785 A1 | 4/2015 | Lee et al. | |
| 2016/0020855 A1* | 1/2016 | Guetta | H04B 10/116 |
| | | | 398/130 |
| 2016/0027358 A1 | 1/2016 | Guo et al. | |
| 2019/0035861 A1 | 1/2019 | Wang et al. | |
| 2019/0206951 A1* | 7/2019 | Xin | H01L 27/3218 |
| 2019/0272057 A1* | 9/2019 | Chen | G06F 3/0416 |
| 2019/0355792 A1* | 11/2019 | Yu | H01L 51/56 |
| 2020/0043990 A1* | 2/2020 | Huangfu | G09G 3/3225 |
| 2020/0327294 A1* | 10/2020 | Cheng | G06F 3/0446 |
| 2021/0225247 A1* | 7/2021 | Matsueda | G09G 3/3266 |

OTHER PUBLICATIONS

First office action of Chinese application No. 201810844277.0 dated Mar. 17, 2020.

* cited by examiner

Forming a sub-pixel arrangement structure including a reference sub-pixel array, a plurality of third sub-pixels, and a plurality of fourth sub-pixels on a substrate; among them, the reference sub-pixel array includes: first sub-pixels and second sub-pixels, both of which are arranged alternately in a first direction and a second direction; in at least one of the first and second directions, one of the third sub-pixels is arranged between one of the first sub-pixels and one of the second sub-pixels adjacent to the one of the first sub-pixels, in the reference sub-pixel array; one of fourth sub-pixels is arranged among four sub-pixels arranged in two rows and two columns in the reference sub-pixel array, the four sub-pixels include two of the first sub-pixels and two of the second sub-pixels, and a center of the one of the fourth sub-pixels is located between two rows of sub-pixels of the four sub-pixels arranged in two rows and two columns

SUB-PIXEL ARRANGEMENT STRUCTURE, MASK DEVICE, AND DISPLAY DEVICE

This application is a 371 of PCT Application No. PCT/CN2019/097880, filed Jul. 26, 2019, which claims priority to Chinese Patent Application No. 201810844277.0, filed Jul. 27, 2018 and entitled "SUB-PIXEL ARRANGEMENT STRUCTURE, MASK DEVICE, DISPLAY PANEL AND DEVICE", the entire contents of which are incorporated herein by reference.

TECHNICAL FIELD

The present disclosure relates to a sub-pixel arrangement structure, a mask device, and a display device.

BACKGROUND

With the development of display technology, the requirements for the display effect of a display device have become increasingly higher.

In the related art, the display device includes a plurality of pixels arranged in an array, and each pixel includes a red sub-pixel, a green sub-pixel, and a blue sub-pixel, which are sequentially arranged along a row direction of the pixels.

SUMMARY

The present disclosure provides a sub-pixel arrangement structure, a mask device, and a display device. The technical solutions are as follows:

In one aspect, a sub-pixel arrangement structure is provided. The sub-pixel arrangement structure includes: a reference sub-pixel array, a plurality of third sub-pixels, and a plurality of fourth sub-pixels, wherein the reference sub-pixel array includes: first sub-pixels and second sub-pixels, both of which are arranged alternately in a first direction and a second direction;

in at least one of the first and second directions, one of the third sub-pixels is arranged between one of the first sub-pixels and one of the second sub-pixels adjacent to the one of the first sub-pixels, in the reference sub-pixel array; and one of the fourth sub-pixels is arranged among four sub-pixels arranged in two rows and two columns in the reference sub-pixel array, the four sub-pixels include two of the first sub-pixels and two of the second sub-pixels, and a center of the one of the fourth sub-pixels is located between two rows of sub-pixels of the four sub-pixels arranged in two rows and two columns.

Optionally, the fourth sub-pixels and the first sub-pixels are alternately arranged in a third direction; the fourth sub-pixels and the second sub-pixels are arranged alternately in the third direction; and the third direction is intersected with both the first and second directions.

Optionally, for at least one type of the first and second sub-pixels, a size of the sub-pixels in the second direction is larger than the size of the sub-pixels in the first direction; and the third sub-pixels are located between adjacent first and the second sub-pixels only in the first direction.

Optionally, the third sub-pixels and the fourth sub-pixels are arranged alternately in the second direction.

Optionally, a size of the third sub-pixels is smaller than a size of the fourth sub-pixels in the first and second directions, and the size of the fourth sub-pixels is smaller than the size of the first and second sub-pixels in the second direction.

Optionally, within a circumscribed rectangular area of the four sub-pixels arranged in two rows and two columns in the reference sub-pixel array, a number of the first sub-pixels, a number of the second sub-pixels, and a number of the third sub-pixels are all two times a number of the fourth sub-pixels.

Optionally, for at least one type of the first and second sub-pixels, a size of the sub-pixels in the second direction is larger than the size of the sub-pixels in the first direction; and the third sub-pixels are all located between the adjacent first and second sub-pixels in the first and second directions.

Optionally, the third sub-pixels and the fourth sub-pixels are arranged alternately in the first and second directions.

Optionally, in the first and second directions, a size of the third sub-pixels is smaller than a size of the fourth sub-pixels, and the size of the fourth sub-pixels is equal to the size of the first and second sub-pixels.

Optionally, within a circumscribed rectangular area of the four sub-pixels arranged in two rows and two columns in the reference sub-pixel array, a number of the first sub-pixels and a number of the second sub-pixels are both two times a number of the fourth sub-pixels, and a number of the third sub-pixels is four times the number of the fourth sub-pixels.

Optionally, centers of the four sub-pixels arranged in two rows and two columns in the reference sub-pixel array are located at four vertexes of a rectangle, and centers of all the sub-pixels in the reference sub-pixel array are located at vertexes of a plurality of rectangles arranged in a checkerboard pattern.

Optionally, the sub-pixel arrangement structure is located on a substrate; orthographic projections of the sub-pixels in the sub-pixel arrangement structure on the substrate approximately have a shape of a polygon; and a ratio of a maximum spacing to a minimum spacing between two opposite sides of any two adjacent sub-pixels ranges from 0.8 to 1.2.

Optionally, orthographic projections of the first and second sub-pixels on the substrate approximately have a shape of an octagon; orthographic projections of the third sub-pixels on the substrate approximately have a shape of a rectangle; and orthographic projections of the fourth sub-pixels on the substrate approximately have a shape of a hexagon.

Optionally, the octagon includes two sides having an angle of less than 3 degrees with the first direction, and two sides having an angle of less than 3 degrees with the second direction; the rectangle includes two sides having an angle of less than 3 degrees with the first direction, and two sides having an angle of less than 3 degrees with the second direction; and the hexagon includes two sides having an angle of less than 3 degrees with the first direction.

Optionally, orthographic projections of the first, second and fourth sub-pixels on the substrate approximately have a shape of an octagon; and orthographic projections of the third sub-pixels on the substrate approximately have a shape of a square.

Optionally, the octagon includes two sides having an angle of less than 3 degrees with the first direction, and two sides having an angle of less than 3 degrees with the second direction; and the rectangle includes two sides having an angle of less than 3 degrees with the first direction, and two sides having an angle of less than 3 degrees with the second direction.

Optionally, the polygon is a rounded polygon.

Optionally, a ratio of spacing between any two adjacent sub-pixels in the sub-pixel arrangement structure to a target spacing ranges from 0.8 to 1.2.

Optionally, wherein colors of the first, second, third and fourth sub-pixels include: red, blue, green, and a first color; and the first color includes any one of white, yellow, and cyan.

Optionally, either of the first and second sub-pixels has a color of red, and the other has a color of blue; and the color of the third sub-pixels is the first color, and the color of the fourth sub-pixels is green.

Optionally, the sub-pixel arrangement structure is located on the substrate; blue sub-pixels are present among the first, second, third and fourth sub-pixels; and the blue sub-pixels are sub-pixels which have the largest area of the orthographic projection on the substrate, in the sub-pixel arrangement structure.

Optionally, the fourth sub-pixels and the first sub-pixels are alternately arranged in a third direction; the fourth sub-pixels and the second sub-pixels are arranged alternately in the third direction; and the third direction is intersected with both the first and second directions;

for each type of the first and second sub-pixels, a size of the sub-pixels in the second direction is larger than the size of the sub-pixels in the first direction; and the third sub-pixels are located between adjacent first and the second sub-pixels only in the first direction;

the third sub-pixels and the fourth sub-pixels are arranged alternately in the second direction; a size of the third sub-pixels is smaller than a size of the fourth sub-pixels in the first and second directions, and the size of the fourth sub-pixels is smaller than the size of the first and second sub-pixels in the second direction;

within a circumscribed rectangular area of the four sub-pixels arranged in two rows and two columns in the reference sub-pixel array, a number of the first sub-pixels, a number of the second sub-pixels, and a number of the third sub-pixels are all two times a number of the fourth sub-pixels; centers of the four sub-pixels arranged in two rows and two columns in the reference sub-pixel array are located at four vertexes of a rectangle, and centers of all the sub-pixels in the reference sub-pixel array are located at vertexes of a plurality of rectangles arranged in a checkerboard pattern;

a ratio of a maximum spacing to a minimum spacing between two opposite sides of any two adjacent sub-pixels ranges from 0.8 to 1.2;

either of the first and second sub-pixels has a color of red, and the other has a color of blue; and the color of the third sub-pixels is the first color, and the color of the fourth sub-pixels is green; the first color includes any one of white, yellow and cyan; the sub-pixel arrangement structure is located on the substrate; and the blue sub-pixels are sub-pixels which have the largest area of the orthographic projection on the substrate in the sub-pixel arrangement structure.

Optionally, the fourth sub-pixels and the first sub-pixels are alternately arranged in a third direction; the fourth sub-pixels and the second sub-pixels are arranged alternately in the third direction; and the third direction is intersected with both the first and second directions;

for each type of the first and second sub-pixels, a size of the sub-pixels in the second direction is equal to the size of the sub-pixels in the first direction; and the third sub-pixels are located between adjacent first and the second sub-pixels in the first and second directions;

the third sub-pixels and the fourth sub-pixels are arranged alternately in the first and second directions; in the first and second directions, a size of the third sub-pixels is smaller than a size of the fourth sub-pixels, and the size of the fourth sub-pixels is equal to the size of the first and second sub-pixels;

within a circumscribed rectangular area of the four sub-pixels arranged in two rows and two columns in the reference sub-pixel array, a number of the first sub-pixels and a number of the second sub-pixels are both two times a number of the fourth sub-pixels, and a number of the third sub-pixels is four times the number of the fourth sub-pixels;

centers of the four sub-pixels arranged in two rows and two columns in the reference sub-pixel array are located at four vertexes of a rectangle, and centers of all the sub-pixels in the reference sub-pixel array are located at vertexes of a plurality of rectangles arranged in a checkerboard pattern;

in the sub-pixel arrangement structure, a ratio of a maximum spacing to a minimum spacing between two opposite sides of any two adjacent sub-pixels ranges from 0.8 to 1.2;

either of the first and second sub-pixels has a color of red, and the other has a color of blue; and the color of the third sub-pixels is the first color, and the color of the fourth sub-pixels is green; the first color includes any one of white, yellow and cyan; the sub-pixel arrangement structure is located on the substrate; and the blue sub-pixels are sub-pixels which have the largest area of the orthographic projection on the substrate in the sub-pixel arrangement structure.

In another aspect, a mask device for manufacturing the sub-pixel arrangement structure is provided. The sub-pixel arrangement structure includes: first sub-pixels, second sub-pixels, third sub-pixels and fourth sub-pixels; and the mask device includes: at least one mask plate, wherein the at least one mask plate has openings corresponding to the respective sub-pixels of the first, second, third and fourth sub-pixels, and the openings are adapted to manufacture sub-pixels corresponding to the openings.

Optionally, the at least one mask plate includes: four mask plates; the four mask plates are in one-to-one correspondence to the first sub-pixels, the second sub-pixels, the third sub-pixels, and the fourth sub-pixels; and each of the mask plates has openings corresponding to the respective sub-pixels.

In yet another aspect, a display device is provided. The display device includes the sub-pixel arrangement structure.

BRIEF DESCRIPTION OF THE DRAWINGS

FIG. 11 is a flowchart of a method for manufacturing a sub-pixel arrangement structure according to an embodiment of the present disclosure.

DETAILED DESCRIPTION

The present disclosure will be described in further detail with reference to the accompanying drawings, to present the principles, technical solutions, and advantages of the present disclosure more clearly.

Typically, a resolution of a display device depends on the size of the sub-pixels. Therefore, the size of the sub-pixels is generally reduced to increase the resolution of the display device. However, due to process limitations, the reduction in the size of the sub-pixels is limited, and thus the improvement of the resolution of the display device is restricted. The sub-pixel arrangement structure provided by the embodiments of the present disclosure may increase the resolution of the display device by sharing the sub-pixels among virtual pixels, and make up the defect that the manufacturing process limits the improvement of the resolution of the display device.

Figure 1:
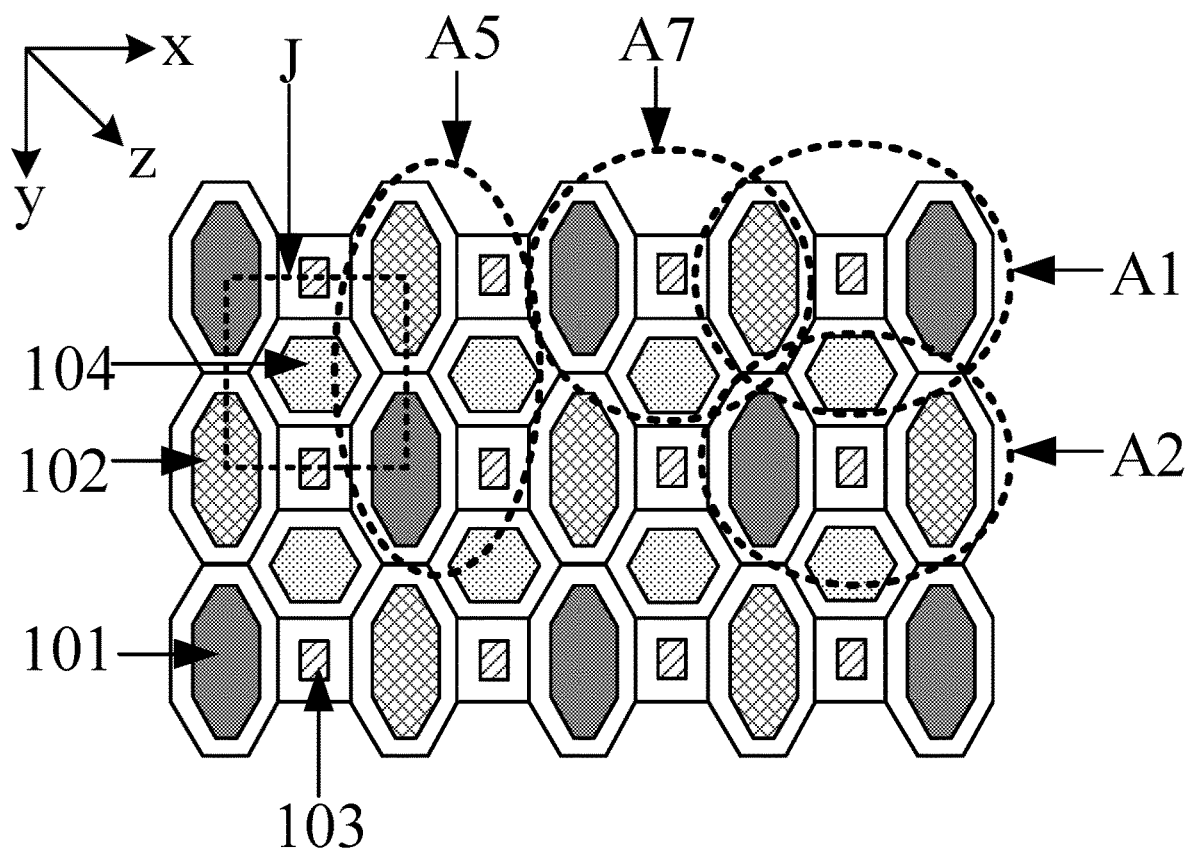
FIG. 1 is a schematic diagram of a sub-pixel arrangement structure according to an embodiment of the present disclosure.

As an example, FIG. 1 is a schematic diagram of a sub-pixel arrangement structure according to an embodiment of the present disclosure. As shown in FIG. 1, the sub-pixel arrangement structure may include: a reference sub-pixel array, a plurality of third sub-pixels 103, and a plurality of fourth sub-pixels 104.

Among them, the reference sub-pixel array includes: first sub-pixels 101 and second sub-pixels 102, both of which are arranged alternately in a first direction x and a second direction y. It can be seen that a plurality of first sub-pixels 101 and a plurality of second sub-pixels 102 may constitute the reference sub-pixel array, and the first sub-pixels 101 and the second sub-pixels 102 in the reference sub-pixel array are arranged alternately in a first direction x and a second direction y. The first direction x is a row direction of the sub-pixels in the reference sub-pixel array, the second direction y is a column direction of the sub-pixels in the reference sub-pixel array, and the first direction x and the second direction y may be perpendicular to each other. Of course, the first direction x may not be perpendicular to the second direction y, which is not limited in the embodiments of the present disclosure.

In at least one of the first direction x and the second direction, one of the third sub-pixels 103 is arranged between one of the first sub-pixels 101 and one of the second sub-pixels 102 adjacent to the one of the first sub-pixels 101, in the reference sub-pixel array; and one of the fourth sub-pixels 104 is arranged among four sub-pixels arranged in two rows and two columns in the reference sub-pixel array, the four sub-pixels include two of the first sub-pixels 101 and two of the second sub-pixels 102, and a center of the one of the fourth sub-pixels 104 is located between two rows of sub-pixels of the four sub-pixels arranged in two rows and two columns. Therefore, each of the fourth sub-pixels 104 is surrounded by four sub-pixels (two of the first sub-pixels 101 and two of the second sub-pixels 102 respectively) adjacent to the fourth sub-pixel 104 in the reference sub-pixel array.

Figure 2:
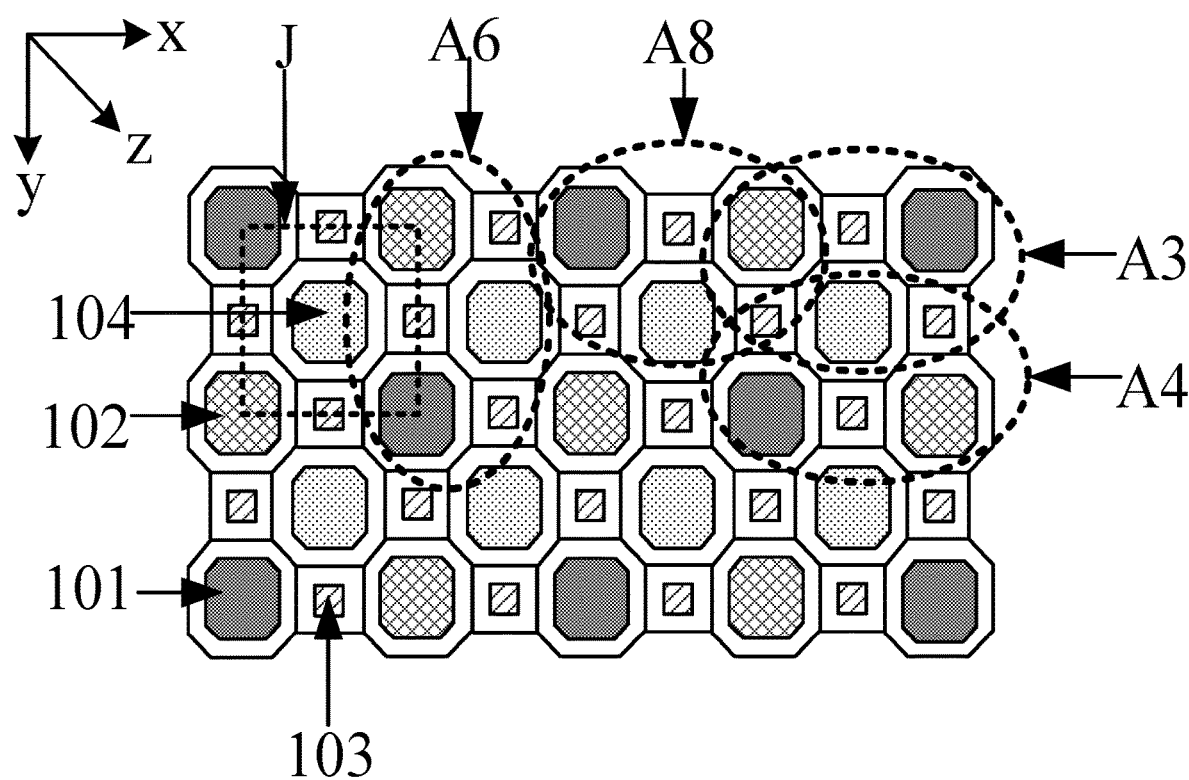
FIG. 2 is a schematic diagram of another sub-pixel arrangement structure according to an embodiment of the present disclosure.

It should be noted that FIG. 1 only shows, by way of example, that in the first direction x, one of the third sub-pixels 103 is arranged between one of the first sub-pixels 101 and one of the second sub-pixels 102 adjacent to the one of the first sub-pixels 101, in the reference sub-pixel array. Alternatively, FIG. 2 shows that in the first direction x and the second direction y, one of the third sub-pixels 103 is arranged between one of the first sub-pixels 101 and one of the second sub-pixels 102 adjacent to the one of the first sub-pixels 101, in the reference sub-pixel array. Alternatively, it is also possible that only in the second direction y, one of the third sub-pixels is arranged between one of the first sub-pixels 101 and one of the second sub-pixels 102 adjacent to the one of the first sub-pixels 101, in the reference sub-pixel array. This is not illustrated in this embodiment of the present disclosure.

It should be noted that the sub-pixel in the embodiments of the present disclosure is an area for displaying one piece of pixel data, for example, a light-emitting area formed by an organic light-emitting diode, or an area where an opening of a pixel defining layer is located. As an example, when the sub-pixel is a light-emitting area formed by an organic light-emitting diode, the sub-pixel may include: an anode, a hole injection layer, a hole transport layer, a light-emitting layer, an electron transport layer, an electron injection layer, a cathode, and other structures. Moreover, the sub-pixel is located in an opening of a pixel defining layer.

In a strict sense, a pixel is defined by a complete set of a first sub-pixel, a second sub-pixel, and a third sub-pixel. In the embodiments of the present disclosure, adjacent first, second, third, and fourth sub-pixels may constitute one pixel, and one or more sub-pixels may be shared between two adjacent pixels. It can be seen that the pixels in the embodiments of the present disclosure are not pixels in the strict sense. Therefore, the pixels in the embodiments of the present disclosure are described as "virtual pixels".

In addition, an image displayed by the display device is composed of a plurality of light-emitting "dots". Typically, human eyes can distinguish the central brightness position of a pixel (that is, the central position of the "dot"), but cannot distinguish the boundary of each pixel. In this way, when the virtual pixels constituting the common sub-pixels are used to display the image, the display device may include more virtual pixels, and thus the human eyes may be allowed to perceive more "dots" in the image when the display device displays the image, so that the human eyes may see a sharper image. This is equivalent to improving the resolution of the display device including the sub-pixel arrangement structure.

In summary, in the sub-pixel arrangement structure provided by the embodiments of the present disclosure, adjacent first, second, third and fourth sub-pixels may constitute a virtual pixel, and adjacent two virtual pixels may share the sub-pixels, and the sub-pixel arrangement structure may constitute more virtual pixels. In this way, the human eyes may perceive a clearer image when viewing an image displayed by the sub-pixel arrangement structure, which is equivalent to improving the resolution and display effect of the display device including the sub-pixel arrangement structure.

Alternatively, the fourth sub-pixels 104 and the first sub-pixels 101 are arranged alternately in a third direction z, and the fourth sub-pixels 104 and the second sub-pixels 102 are also arranged alternately in the third direction z. The third direction z is intersected with both the first direction x and the second direction y. For instance, both an angle between the third direction z and the first direction x and an angle between the third direction z and the second direction y may be 45 degrees. Alternatively, the angle between the third direction z and the first direction x may not be 45 degrees (such as, 40 degrees and the like), and the angle between the third direction z and the second direction y may not be 45 degrees (such as, 50 degrees and the like), which is not limited in the embodiments of the present disclosure.

Alternatively, continuing referring to FIG. 1, for at least one type of the first sub-pixels 101 and the second sub-pixels 102, a size of the sub-pixels in the second direction y is larger than the size of the sub-pixels in the first direction x, and the third sub-pixels 103 are located between the adjacent first and second sub-pixels 101 and 102 in the first direction x only.

Alternatively, in the second direction y, the third sub-pixels 103 and the fourth sub-pixels 104 are arranged alternately. Here, the third sub-pixels 103 and the fourth sub-pixels 104 constitute an auxiliary sub-pixel array. Alternatively, in the first and second directions, the size of the third sub-pixels 103 is smaller than the size of the fourth sub-pixels 104, and the size of the fourth sub-pixels 104 is smaller than the size of the first and second sub-pixels 101 and 102 in the second direction.

Within a circumscribed rectangular area of the four sub-pixels arranged in two rows and two columns in the reference sub-pixel array, a number of the first sub-pixels 101, a number of the second sub-pixels 102, and a number of the third sub-pixels 103 are all two times a number of the fourth sub-pixels 104. As an example, FIG. 1 shows two first sub-pixels 101, two second sub-pixels 102, two third sub-pixels 103, and one fourth sub-pixel 104 in the rectangular area by way of example.

Alternatively, referring to FIG. 2, for at least one type of the first and second sub-pixels 101 and 102, the size of the sub-pixels in the second direction y is equal to the size of the sub-pixels in the first direction x; and in the first direction x and the second direction y, the third sub-pixels 103 are located between adjacent first and second sub-pixels 101 and 102.

Alternatively, the third sub-pixels 103 and the fourth sub-pixels 104 may be arranged alternately in both of the first direction x and the second direction y. Alternatively, in the first direction x and the second direction y, the size of the third sub-pixels 103 is smaller than the size of the fourth sub-pixels 104, and the size of the fourth sub-pixels 104 is equal to the size of the first and second sub-pixels 101 and 102.

Alternatively, within a circumscribed rectangular area of the four sub-pixels arranged in two rows and two columns in the reference sub-pixel array, a number of the first sub-pixels 101 and a number of the second sub-pixels 102 are both two times a number of the fourth sub-pixels 104, and a number of the third sub-pixels 103 is four times the number of the fourth sub-pixels 104. As an example, FIG. 2 shows two first sub-pixels 101, two second sub-pixels 102, four third sub-pixels 103, and one fourth sub-pixel 104 in the rectangular area, by way of example.

Alternatively, continuing referring to FIG. 1 or FIG. 2, centers of the four sub-pixels arranged in two rows and two columns in the reference sub-pixel array may be located at four vertexes of a rectangle J, and centers of all the sub-pixels in the reference sub-pixel array may be located at vertexes of a plurality of rectangles arranged in a checkerboard pattern. It should be noted that the rectangle J may be a virtual rectangle. Among the four sub-pixels, the two first sub-pixels 101 may be located at a pair of diagonal vertexes of the rectangle; the two second sub-pixels 102 may be located at the other pair of diagonal vertexes of the rectangle; the fourth sub-pixel 104 may be located at the center of the rectangle; the third sub-pixel 103 in FIG. 1 may be located at midpoints of two opposite sides of the rectangle, and the third sub-pixel 103 in FIG. 2 may be located at midpoints of four sides of the rectangle.

A sub-pixel in this embodiment of the present disclosure is located at a vertex, a center, or a midpoint may be interpreted as: the sub-pixel covers the vertex, the center, or the midpoint; and further, the center of the sub-pixel may coincide with the vertex, the center, or the midpoint. In addition, the center of the sub-pixel may be approximately a geometric center of the sub-pixel, or may be an area radiating from the geometric center to the outside of the sub-pixel, for example, by about a certain size (such as ⅕ or ⅙ pixel size).

Alternatively, continuing referring to FIG. 1 or FIG. 2, the colors of the first sub-pixels 101, the second sub-pixels 102, the third sub-pixels 103, and the fourth sub-pixels 104 may be red, blue, green and a first color, and the first color may be different from red, blue, and green. For example, the first color may include white, yellow, or cyan. It should be noted that if the first color is white, a display brightness of the display device in which the sub-pixel arrangement structure is located may be increased; and if the first color is yellow or cyan, a color gamut of the display device in which the sub-pixel arrangement structure is located may be increased.

As an example, the color of the first sub-pixels 101 may be blue, the color of the second sub-pixels 102 may be red, the color of the third sub-pixels 103 may be white, and the color of the fourth sub-pixels 104 may be green. Or, the color of the first sub-pixels 101 may be red, the color of the second sub-pixels 102 may be blue, the color of the third sub-pixels 103 may be green, and the color of the fourth sub-pixels 104 may be yellow, which are not limited in the embodiments of the present disclosure.

Alternatively, the sub-pixel arrangement structure above may be located on a substrate. Among the first sub-pixels 101, the second sub-pixels 102, the third sub-pixels 103 and the fourth sub-pixels 104, the area of the orthographic projection of each of the sub-pixels having a blue color on the substrate may be larger. Since the sub-pixels having a blue color typically decay quickly, the lifetime of the sub-pixels determines the service time of the display device. In this embodiment of the present disclosure, the orthographic projection of the sub-pixels having the blue color on the substrate has a larger area, so that the life of the sub-pixels having the blue color is longer, thereby prolonging the service time of the display device.

As an example, in the sub-pixel arrangement structure shown in FIG. 1, the area of the orthographic projection of each of the first sub-pixels 101 on the substrate (not shown in FIG. 1) may be equal to the area of the orthographic projection of each of the second sub-pixels 102 on the substrate; and the area of the orthographic projection of each of the first sub-pixels 101 on the substrate may be larger than the area of the orthographic projection of each of the fourth sub-pixels 104 on the substrate; and the area of the orthographic projection of each of the fourth sub-pixels 104 on the substrate may be larger than the area of the orthographic projection of each of the third sub-pixels 103 on the substrate. Here, the color of either of the first sub-pixels 101 and the second sub-pixels 102 may be blue. In the sub-pixel arrangement structure shown in FIG. 2, the area of the orthographic projection of each of the first sub-pixels 101 on the substrate (not shown in FIG. 2) may be the same as the area of the orthographic projection of each of the second sub-pixels 102 on the substrate and the area of the orthographic projection of each of the fourth sub-pixels 104 on the substrate; and the area of the orthographic projection of each of the fourth sub-pixels 104 on the substrate may be larger than the area of the orthographic projection of each of the third sub-pixels 103 on the substrate. Here, the color of any of the first sub-pixels 101, the second sub-pixels 102, and the fourth sub-pixels 104 may be blue.

Alternatively, spacing between any two adjacent sub-pixels in the sub-pixel arrangement may be a target spacing, and the orthographic projection of each of the sub-pixels, in the sub-pixel arrangement, on the substrate may approximately have the shape of a polygon. As an example, the shape of the sub-pixel may be the shape of an opening in a pixel defining layer for defining the sub-pixels. A ratio of the maximum spacing to the minimum spacing between two opposite sides in any two adjacent sub-pixels may range from 0.8 to 1.2. For example, when the ratio of the maximum spacing to the minimum spacing between two opposite sides in any two adjacent sub-pixels is 1, the two sides are parallel to each other. It should be noted that, due to process limitations, the sides of the polygon above may not be completely straight. Therefore, the sub-pixels in the embodiments of the present disclosure are desirable as long as the spacing of the adjacent sub-pixels is approximately equal and two opposite planes in any two adjacent sub-pixels are approximately parallel, which is not limited in the embodiments of the present disclosure. The ratio of the maximum spacing to the minimum spacing between two opposite sides in any two adjacent sub-pixels may not range from 0.8 to 1.2, and may also range, for example, from 0.9 to 1.1, etc., which is not limited in the embodiments of the present disclosure.

In addition, regardless of whether the orthographic projection of the sub-pixels on the substrate is approximately polygonal, the ratio of spacing between any two adjacent sub-pixels in the sub-pixel arrangement structure to the target spacing may range from 0.8 to 1.2 (for example, the ratio is equal to 1, and the range may also be other ranges, such as 0.9 to 1.1, etc.). It should be noted that the spacing is equivalent to the spacing of multiple openings in the pixel defining layer which is used for defining the sub-pixels. In this way, when a light-emitting layer in the sub-pixels is manufactured, the spacing of the openings for forming the light-emitting layer can be guaranteed to be approximately equal, so that the spacing of the formed light-emitting layers are approximately equal, thereby facilitating the fabrication of high-resolution pixels.

Alternatively, in the embodiments of the present disclosure, the orthographic projection of each of the sub-pixels on the substrate may approximately have the shape of a polygon. For example, the orthographic projection of each of the sub-pixels on the substrate may have the shape of a polygon, a rounded polygon, an approximate circle and the like.

As an example, all the sub-pixels in the embodiments of the present disclosure may be closely arranged, so that the display device may have more sub-pixels. For example, in FIG. 1, the orthographic projections of the first sub-pixels 101 and the second sub-pixels 102 on the substrate may both approximately have the shape of an octagon; the orthographic projections of the third sub-pixels 103 on the substrate may approximately have the shape of a rectangle; and the orthographic projections of the fourth sub-pixels 104 on the substrate may approximately have the shape of a hexagon (such as a regular hexagon). Alternatively, the octagon may include two sides having an angle of less than 3 degrees (or other degrees, such as 4 degrees) with the first direction x, and two sides having an angle of less than 3 degrees (or other degrees, such as 4 degrees) with the second direction y; the rectangle may include two sides having an angle of less than 3 degrees (or other degrees, such as 4 degrees) with the first direction x, and two sides having an angle of less than 3 degrees (or other degrees, such as 4 degrees) with the second direction y; and the hexagon may include two sides having an angle of less than 3 degrees (or other degrees, such as 4 degrees) with the first direction x. For instance, the octagon includes two sides parallel to the first direction x, and two sides parallel to the second direction y; the rectangle includes two sides parallel to the first direction x, and two sides parallel to the second direction y; and the hexagon includes two sides parallel to the first direction x.

Or, in FIG. 2, the orthographic projections of the first sub-pixels 101, the second sub-pixels 102, and the fourth sub-pixels 104 on the substrate may approximately have the shape of an octagon, and the orthographic projections of the third sub-pixels 103 on the substrate may approximately have the shape of a rectangle (such as a square). Alternatively, the octagon includes two sides having an angle of less than 3 degrees (or other degrees, such as 4 degrees) with the first direction x, and two sides having an angle of less than 3 degrees (or other degrees, such as 4 degrees) with the second direction y; and the rectangle includes two sides having an angle of less than 3 degrees (or other degrees, such as 4 degrees) with the first direction x, and two sides having an angle of less than 3 degrees (or other degrees, such as 4 degrees) with the second direction y. As an example, the octagon may include two sides parallel to the first direction x, and two sides parallel to the second direction y; and the rectangle may include two sides parallel to the first direction x, and two sides parallel to the second direction y.

It should be noted that, in the embodiments of the present disclosure, the orthographic projection of each sub-pixel on the substrate is described to approximately have the shape of a polygon, only by way of example. Alternatively, the orthographic projections of the respective sub-pixels on the substrate may not be polygonal, for example, the orthographic projections of the sub-pixels on the substrate may be approximately circular or elliptical, which is not limited in the embodiments of the present disclosure.

In the embodiment of the present disclosure, adjacent first, second, third and fourth sub-pixels may constitute a virtual pixel. For example, in the sub-pixel arrangement structure shown in FIG. 1, each of the third sub-pixels 103 along with the first sub-pixels 101, the second sub-pixels 102, and the fourth sub-pixel 104, that surround the third sub-pixel 103, may constitute a virtual pixel. In the sub-pixel arrangement structure shown in FIG. 2, every adjacent first sub-pixel 101, second sub-pixel 102 and fourth sub-pixel 104 along with the three third sub-pixels 103 around may constitute a virtual pixel, and the three third sub-pixels 103 in the virtual pixel may be adjacent to both the first sub-pixel 101 and the second sub-pixel 102.

For example, for the structure of the virtual pixel in FIG. 1, a reference may be made to the structures of a virtual pixel A1 and a virtual pixel A2, and the virtual pixel A1 and the virtual pixel A2 may share one fourth sub-pixel 104. For the manner of sharing the sub-pixels between adjacent virtual pixels, a reference may be made to the manner of sharing the sub-pixels between the virtual pixel A1 and the virtual pixel A2, that is, one fourth sub-pixel 104 may be shared between the adjacent virtual pixels in the second direction. Or, for the structure of the virtual pixel, a reference may be made to the structures of the virtual pixel A1 and the virtual pixel A7 in FIG. 1, and the virtual pixel A1 and the virtual pixel A7 may share one second sub-pixel 102. For the manner of sharing the sub-pixels between adjacent virtual pixels, a reference may also be made to the manner of sharing the sub-pixels between the virtual pixel A1 and the virtual pixel A7, that is, one second sub-pixel 102 may be shared between the adjacent virtual pixels in the first direction.

For the structure of the virtual pixel in FIG. 2, a reference may be made to the structures of the virtual pixel A3 and the virtual pixel A4, and the virtual pixel A3 and the virtual pixel A4 may share two third sub-pixels 103 and one fourth sub-pixel 104. For the manner of sharing the sub-pixels between adjacent virtual pixels, a reference may also be made to the manner of sharing the sub-pixels between the virtual pixel A3 and the virtual pixel A4, that is, two third sub-pixels 103 and one fourth sub-pixel 104 may be shared between the adjacent virtual pixels in the second direction. Or, for the structure of the virtual pixel, a reference may be made to the structures of the virtual pixel A3 and the virtual pixel A8 in FIG. 2, and the virtual pixel A3 and the virtual pixel A8 may share one second sub-pixel 102 and one third sub-pixel 103. For the manner of sharing the sub-pixels between adjacent virtual pixels, a reference may also be made to the manner of sharing the sub-pixels between the virtual pixel A3 and the virtual pixel A8, that is, one second sub-pixel 102 and one third sub-pixel 103 may be shared between the adjacent virtual pixels in the first direction.

It should be noted that in the embodiments of the present disclosure, the structures of the virtual pixel and the manner of sharing the sub-pixels between the adjacent virtual pixels are described as above only by way of example. Alternatively, the virtual pixel may have other structures including the adjacent first, second, third and fourth sub-pixels, and the manner of sharing the sub-pixels between the adjacent virtual pixels may also be in other forms, which is not limited in the embodiments of the present disclosure. For example, the structure of the virtual pixel as shown in FIG. 1 may also be the same as the structure of the virtual pixel A5, or the structure of the virtual pixel in FIG. 2 may also be the same as the structure of the virtual pixel A6. One of the virtual pixels in the sub-pixel arrangement structure shown in FIG. 2 may include more sub-pixels.

In summary, in the sub-pixel arrangement structure provided by the embodiments of the present disclosure, adjacent first, second, third and fourth sub-pixels may constitute a virtual pixel, and adjacent two virtual pixels may share the sub-pixels, and the sub-pixel arrangement structure may constitute more virtual pixels. In this way, the human eyes may perceive a clearer image when viewing an image displayed by the sub-pixel arrangement structure, which is equivalent to improving the resolution and display effect of the display device including the sub-pixel arrangement structure.

An embodiment of the present disclosure provides a mask device, which can be used for manufacturing the sub-pixel arrangement structure shown in FIG. 1 or FIG. 2. The mask device may include: one or more mask plates, each of which has a plurality of openings corresponding to the first, second, third and fourth sub-pixels, with the openings adapted to manufacturing of the sub-pixels corresponding thereto.

As an example, the mask device may include: four mask plates, which are in one-to-one correspondence to the first sub-pixels, the second sub-pixels, the third sub-pixels, and the fourth sub-pixels. Here, the one or more mask plates comprise: four mask plates. The four mask plates are in one-to-one correspondence to the first sub-pixels, the second sub-pixels, the third sub-pixels, and the fourth sub-pixels. Each of the mask plates has openings corresponding to the respective sub-pixels.

Figure 3:
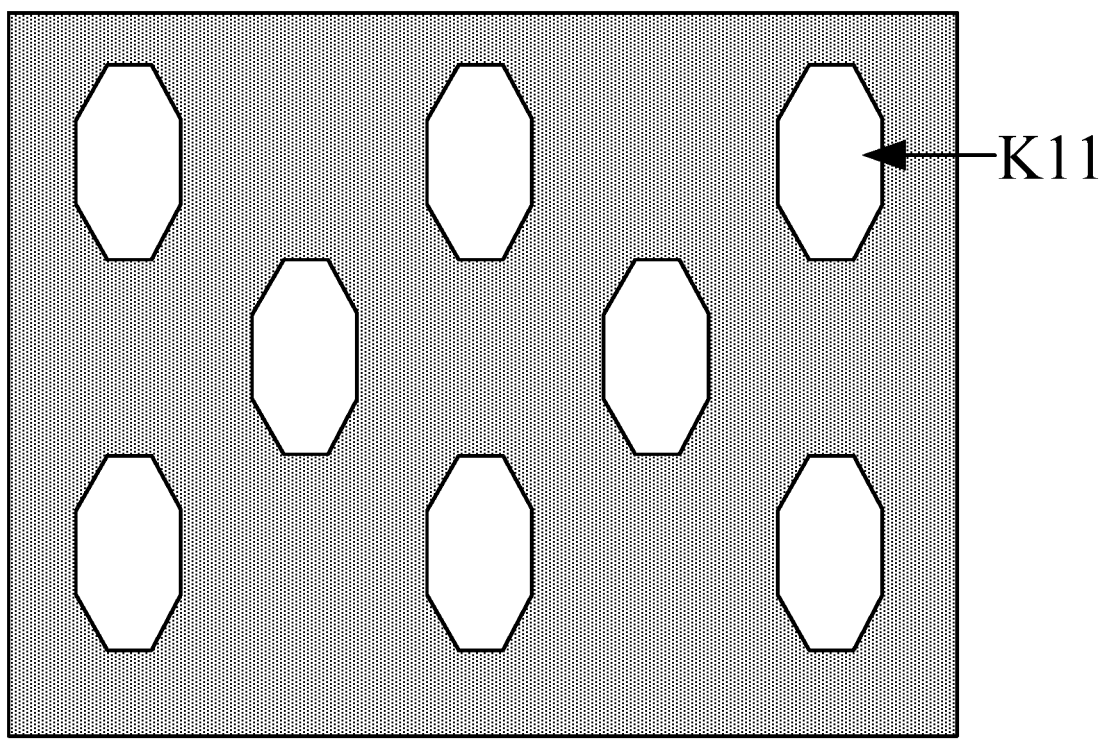
FIG. 3 is a schematic diagram of a mask plate corresponding to first sub-pixels according to an embodiment of the present disclosure.
Figure 4:
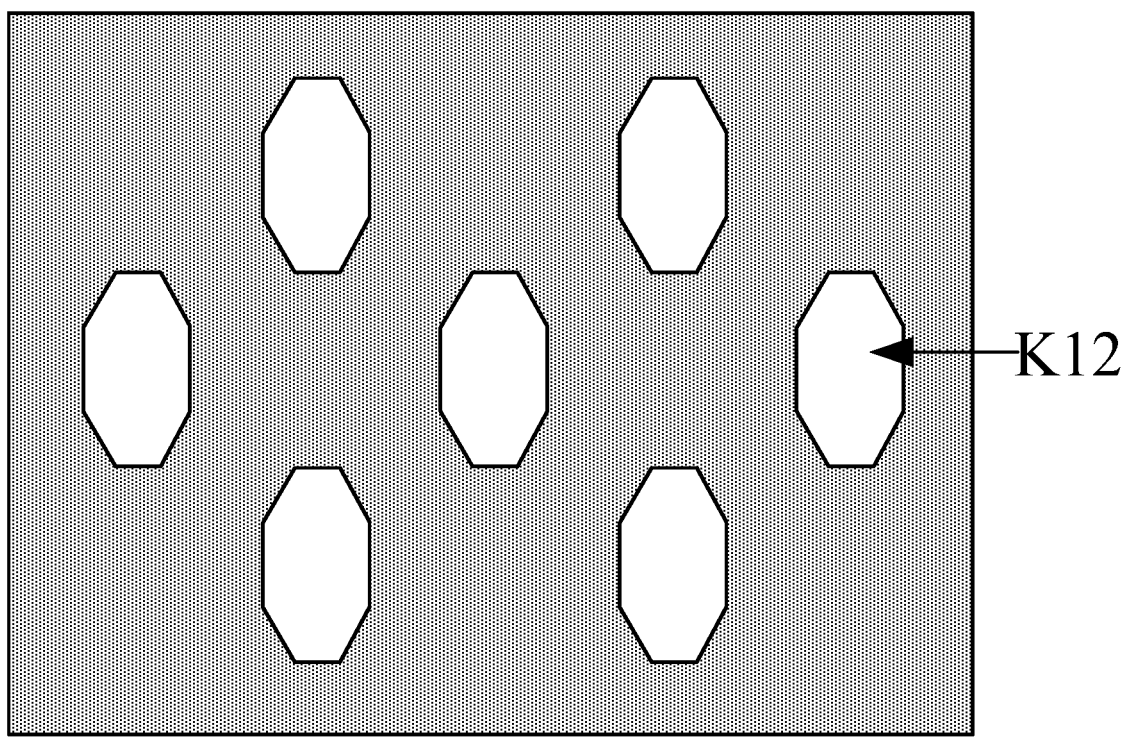
FIG. 4 is a schematic diagram of a mask plate corresponding to second sub-pixels according to an embodiment of the present disclosure.
Figure 5:
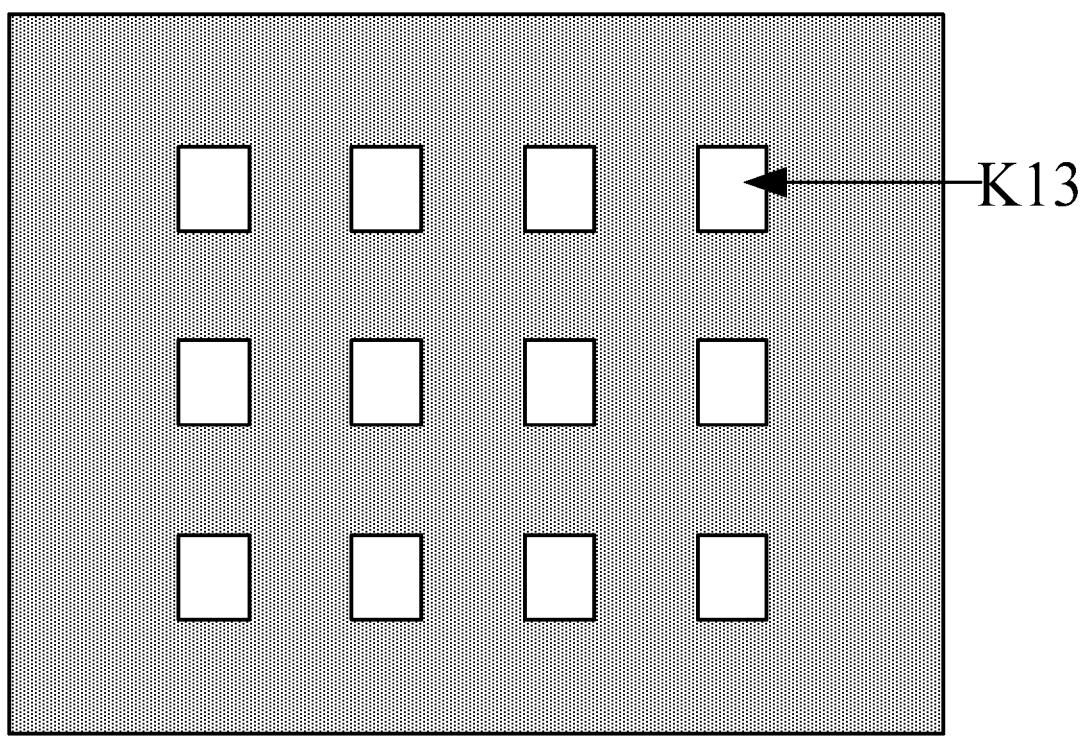
FIG. 5 is a schematic diagram of a mask plate corresponding to third sub-pixels according to an embodiment of the present disclosure.
Figure 6:
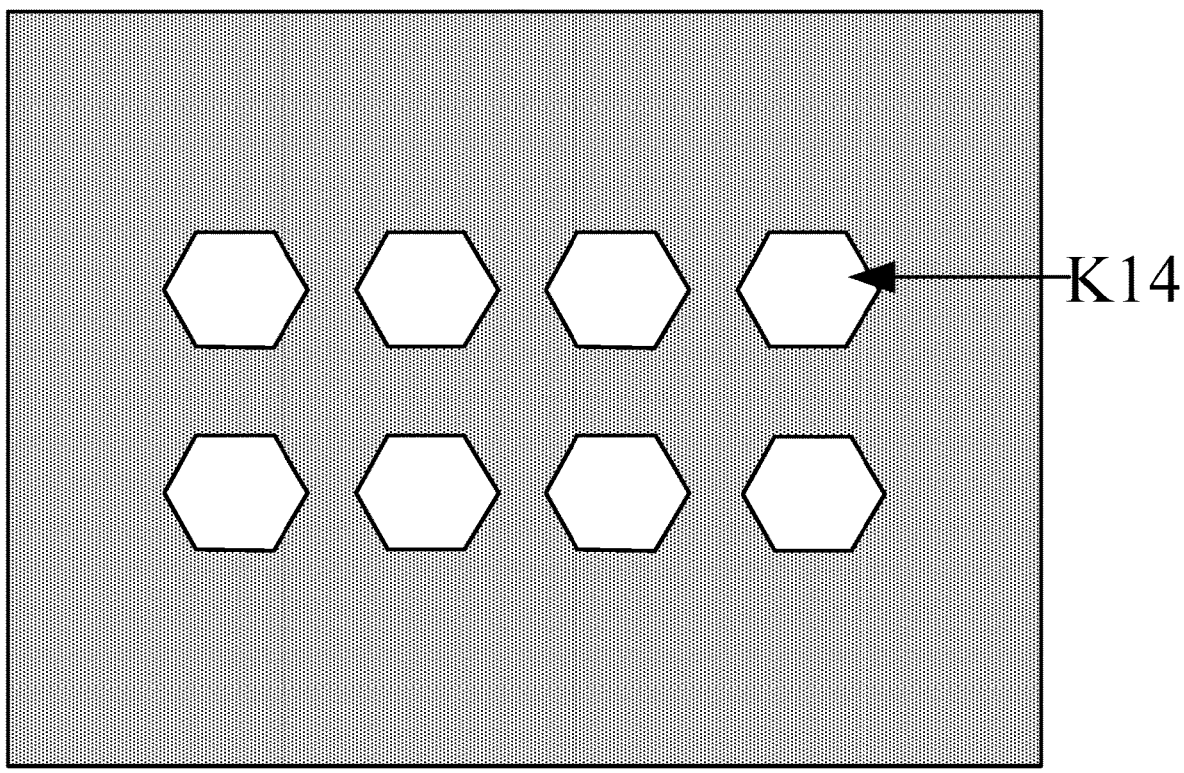
FIG. 6 is a schematic diagram of a mask plate corresponding to fourth sub-pixels according to an embodiment of the present disclosure.

For example, FIG. 3 to FIG. 6 show four mask plates for manufacturing the sub-pixel arrangement structure shown in FIG. 1, respectively. Among them, FIG. 3 shows a mask plate 301 corresponding to the first sub-pixels 101 in the sub-pixel arrangement structure shown in FIG. 1; FIG. 4 shows a mask plate 302 corresponding to the second sub-pixels 102 in the sub-pixel arrangement structure shown in FIG. 1; FIG. 5 shows a mask plate 303 corresponding to the third sub-pixels 103 in the sub-pixel arrangement structure shown in FIG. 1; and FIG. 6 shows a mask plate 304 corresponding to the fourth sub-pixels 104 in the sub-pixel arrangement shown in FIG. 1. When the orthographic projections of the first sub-pixels 101 on the substrate are approximately octagonal, as shown in FIG. 3, the mask plate 301 corresponding to the first sub-pixels 101 may have approximately octagonal openings K11. When the orthographic projections of the second sub-pixels 102 on the substrate are approximately octagonal, as shown in FIG. 4, the mask plate 302 corresponding to the second sub-pixels 102 may have approximately octagonal openings K12. When the orthographic projections of the third sub-pixels 103 on the substrate are approximately rectangular, as shown in FIG. 5, the mask plate 303 corresponding to the third sub-pixels 103 have approximately rectangular openings K13. When the orthographic projections of the fourth sub-pixels 104 on the substrate are approximately regularly hexagonal, as shown in FIG. 6, the mask plate 304 corresponding to the fourth sub-pixels 104 have approximately regularly hexagonal openings K14.

Figure 7:
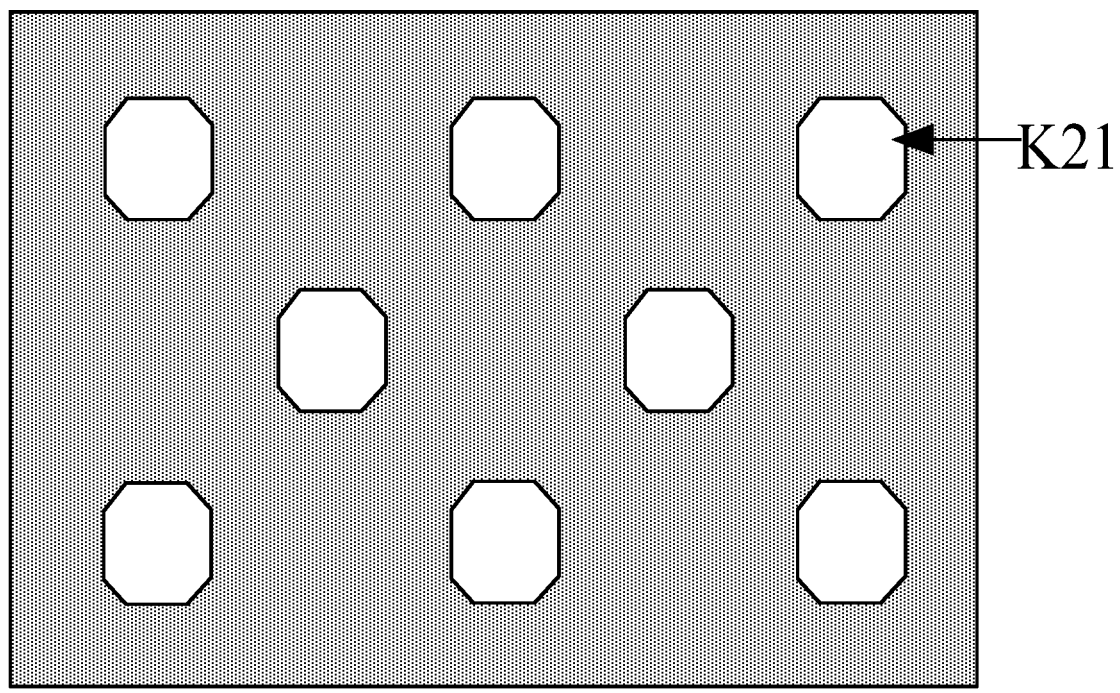
FIG. 7 is a schematic diagram of another mask plate corresponding to the first sub-pixels according to an embodiment of the present disclosure.
Figure 8:
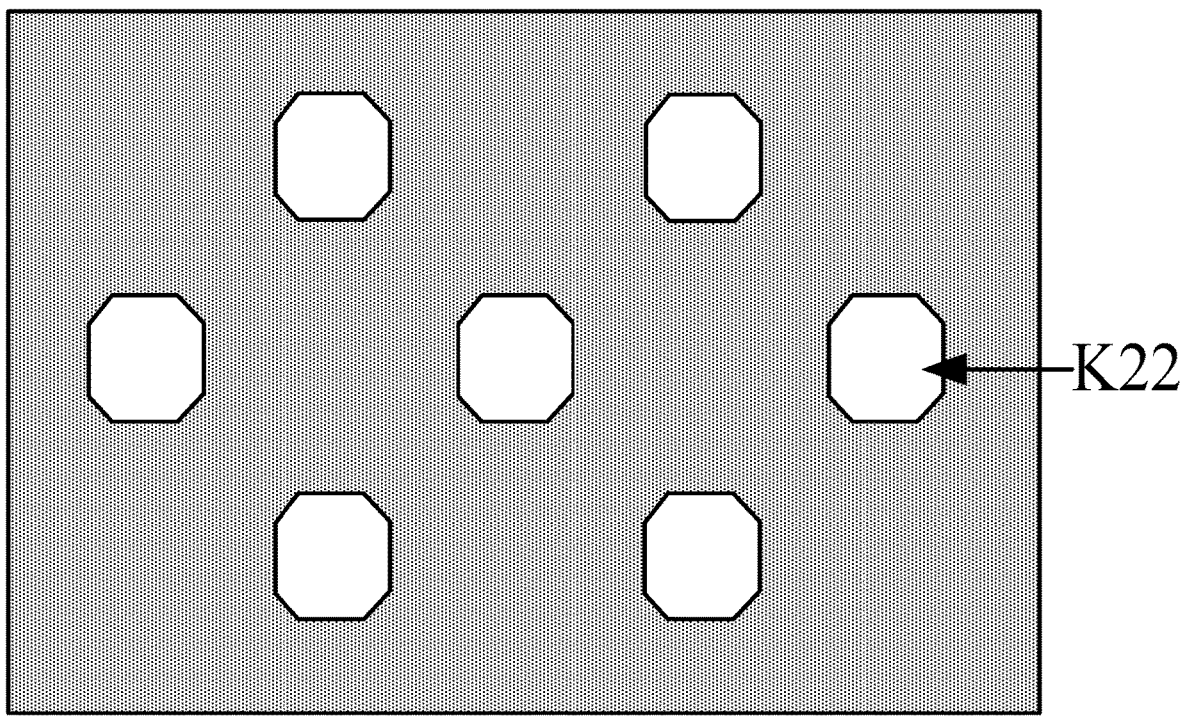
FIG. 8 is a schematic diagram of another mask plate corresponding to the second sub-pixels according to an embodiment of the present disclosure.
Figure 9:
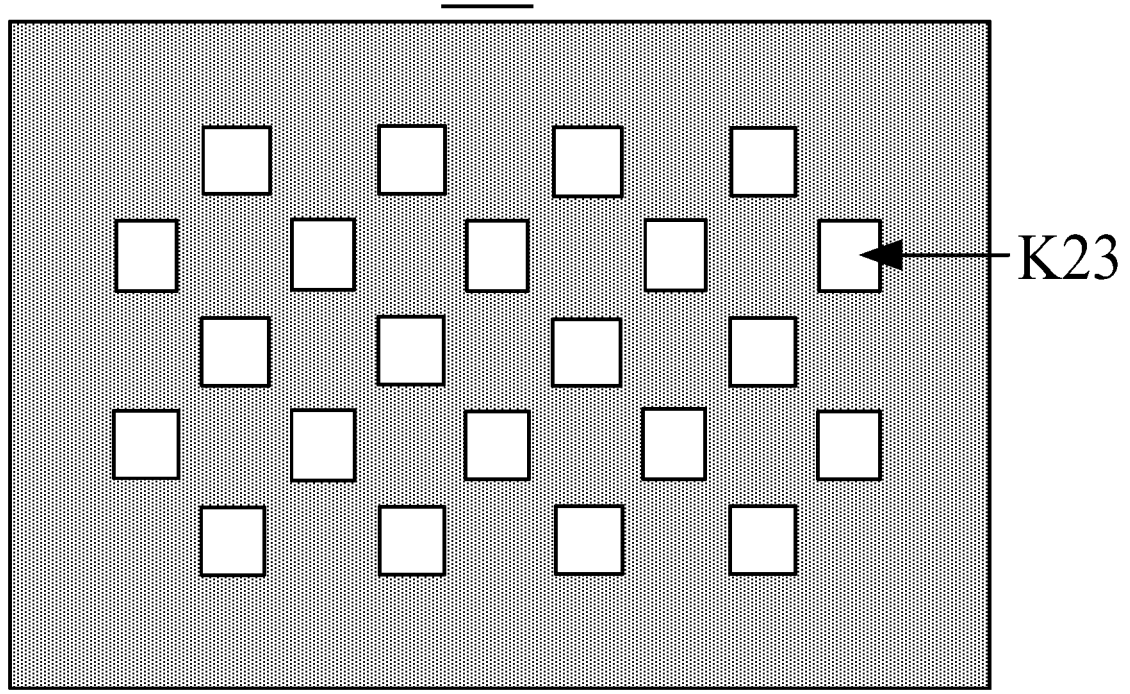
FIG. 9 is a schematic diagram of another mask plate corresponding to the third sub-pixels according to an embodiment of the present disclosure.
Figure 10:
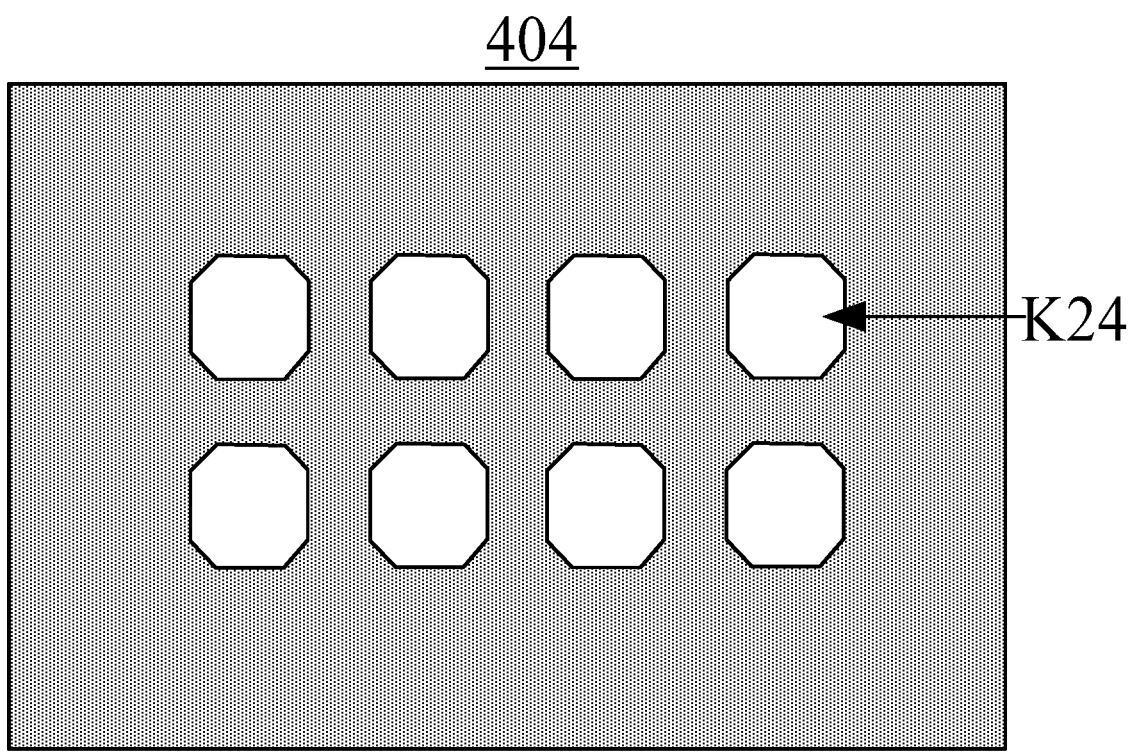
FIG. 10 is a schematic diagram of another mask plate corresponding to the fourth sub-pixels according to an embodiment of the present disclosure.

For another example, FIG. 7 to FIG. 10 show four mask plates for manufacturing the sub-pixel arrangement structure shown in FIG. 2, respectively. Among them, FIG. 7 shows a mask plate 401 corresponding to the first sub-pixels 101 in the sub-pixel arrangement structure shown in FIG. 2. FIG. 8 shows a mask plate 402 corresponding to the second sub-pixels 102 in the sub-pixel arrangement structure shown in FIG. 2; FIG. 9 shows a mask plate 403 corresponding to the third sub-pixels 103 in the sub-pixel arrangement structure shown in FIG. 2; and FIG. 10 shows a mask plate 404 corresponding to the fourth sub-pixels 104 in the sub-pixel arrangement shown in FIG. 2. When the orthographic projections of the first sub-pixels 101 on the substrate are approximately octagonal (such as, regularly octagonal), as shown in FIG. 7, the mask plate 401 corresponding to the first sub-pixels 101 may have approximately octagonal openings K21. When the orthographic projections of the second sub-pixels 102 on the substrate are approximately octagonal (such as, regularly octagonal), as shown in FIG. 8, the mask plate 402 corresponding to the second sub-pixels 102 may have approximately octagonal openings K22. When the orthographic projections of the third sub-pixels 103 on the substrate are approximately rectangular (such as square), as shown in FIG. 9, the mask plate 403 corresponding to the third sub-pixels 103 have approximately square openings K23. When the orthographic projections of the fourth sub-pixels 104 on the substrate are approximately octagonal (such as, regularly octagonal), as shown in FIG. 10, the mask plate 404 corresponding to the fourth sub-pixels 104 have approximately octagonal openings K24.

It should be noted that in the embodiments of the present disclosure, the sub-pixels in the sub-pixel arrangement structure and the mask plates are described in one-to-one correspondence only by way of example. Alternatively, different sub-pixels in the sub-pixel arrangement structure may also correspond to the same mask plate. For example, the first sub-pixels 101 and the second sub-pixels 102 in FIG. 1 may correspond to the same mask plate, and the first sub-pixels 101 and the second sub-pixels 102 in FIG. 2 may also correspond to the same mask plate. If the first sub-pixels 101 are first manufactured using the mask plate, the position of the mask plate may be adjusted when the second sub-pixels 102 are manufactured using the mask plate, so that each opening in the mask plate is over against a place where the corresponding second sub-pixel 102 is formed. It should be noted that if different sub-pixels correspond to the same mask plate, the size of the mask plate needs to be larger than the size of the sub-pixel arrangement structure.

Alternatively, among the mask plates in the mask device, the area of each opening in the mask plate corresponding to the sub-pixels having a blue color may be larger. Assuming that the color of the first sub-pixels is blue, or the color of the second sub-pixels is blue, then in the mask device corresponding to the sub-pixel arrangement structure shown in FIG. 1, the area of each opening K11 corresponding to the respective first sub-pixel 101 may be approximately equal to the area of each opening K12 corresponding to the respective second sub-pixel 102, and the area of each opening K11 may be larger than the area of each opening K14 corresponding to the respective fourth sub-pixel 104; and the area of each opening K14 may be larger than the area of each opening K13 corresponding to the respective third sub-pixel 103. In the mask device corresponding to the sub-pixel arrangement structure shown in FIG. 2, the area of each opening K21 corresponding to the respective first sub-pixel 101, the area of each opening K22 corresponding to the respective second sub-pixel 102, and the area of each opening K24 corresponding to the respective fourth sub-pixel 104 may be approximately equal; and the area of each opening K24 may be larger than the area of each opening K23 corresponding to the respective third sub-pixel 103.

It should be noted that, as shown in any one of FIG. 3 to FIG. 10, the openings in the mask plate in the embodiments of the present disclosure are uniformly distributed. When the sub-pixel arrangement structure is manufactured by using the mask plate provided in the embodiments of the present disclosure, a good screen spreading effect can be achieved, and defects such as mask plate folds are less likely to occur, so that the position accuracy of the respective sub-pixels in the manufactured sub-pixel arrangement structure is high.

Alternatively, the material of each mask plate in the mask device may be metal or non-metal, which is not limited in the embodiments of the present disclosure.

Alternatively, the mask device may further include a cover mask plate, a howling mask plate, an align mask plate, and an assembly frame, all of which are configured to cooperate with the four mask plates above to form the sub-pixels in the sub-pixel arrangement structure.

In summary, in the sub-pixel arrangement structure manufactured by means of the mask device provided by the embodiments of the present disclosure, adjacent first, second, third and fourth sub-pixels may constitute a virtual pixel, and adjacent two virtual pixels may share the sub-pixels, and the sub-pixel arrangement structure may constitute more virtual pixels. In this way, the human eyes may perceive a clearer image when viewing an image displayed by the sub-pixel arrangement structure, which is equivalent to improving the resolution and display effect of the display device including the sub-pixel arrangement structure.

An embodiment of the present disclosure further provides a method for manufacturing a sub-pixel arrangement structure, which may be used in the manufacturing of the sub-pixel arrangement structure according to an embodiment of the present disclosure. As an example, as shown in FIG. 11, the method for manufacturing the sub-pixel arrangement structure may include the following steps.

In step 1101, a sub-pixel arrangement structure including a reference sub-pixel array, a plurality of third sub-pixels, and a plurality of fourth sub-pixels is formed on a substrate. Among them, the reference sub-pixel array includes: first sub-pixels and second sub-pixels, both of which are arranged alternately in a first direction and a second direction. In at least one of the first and second directions, one of the third sub-pixels is arranged between one of the first sub-pixels and one of the second sub-pixels adjacent to the one of the first sub-pixels, in the reference sub-pixel array. One of fourth sub-pixels is arranged among four sub-pixels arranged in two rows and two columns in the reference sub-pixel array, the four sub-pixels include two of the first sub-pixels and two of the second sub-pixels, and a center of the one of the fourth sub-pixels is located between two rows of sub-pixels of the four sub-pixels arranged in two rows and two columns.

Alternatively, when the sub-pixels in the sub-pixel arrangement structure are sub-pixels in an organic light-emitting diode (OLED) display device, the mask device provided in the embodiments of the present disclosure may be used to prepare the sub-pixel arrangement structure above. As an example, the mask device may include; four mask plates. The four mask plates are in one-to-one correspondence to the first sub-pixels, the second sub-pixels, the third sub-pixels, and the fourth sub-pixels. Each of the mask plates has openings corresponding to the respective sub-pixels. Here, when the sub-pixel arrangement structure is formed on the substrate, each of the four mask plates may be used to form the sub-pixels corresponding to the mask plate on the substrate. As an example, when each mask plate is utilized to prepare the sub-pixels corresponding thereto, the substrate and the mask plate may be placed in an evaporation chamber, and then the mask plate is placed at one side of the substrate, and an organic material is vapor-deposited onto the substrate through the openings of the mask plate from a side of the mask plate away from the substrate, thereby forming a light-emitting layer in the sub-pixels corresponding to the mask plate.

An embodiment of the present disclosure further provides a display device, which may include the sub-pixel arrangement structure shown in FIG. 1 or FIG. 2.

The display device may be an OLED display device, where each sub-pixel may include a light-emitting unit (i.e., an organic light-emitting diode), and the light-emitting unit of each sub-pixel may directly emit light having the desired color and brightness.

Or, the display device may also be a liquid crystal display device, where each sub-pixel includes a light filtering unit, and light emitted by a backlight source may pass through the light filtering unit of the respective sub-pixels to become the light having the desired color and brightness. Moreover, when the display device is a liquid crystal display device, if the color of the third sub-pixels in FIG. 1 or FIG. 2 is white, then the brightness of the light emitted by the pixels may be increased, and the consumption of the backlight can be reduced.

When the display device is controlled to display an image, actual image information to be displayed may be received first; then virtual image information to be displayed for each virtual pixel may be generated based on the actual image information; and then, the display components of the sub-pixels in each virtual pixel may be determined by a virtual algorithm and thus the sub-pixels are driven to emit light based on the display components of the respective sub-pixels, thereby enabling the display device to display the image.

Alternatively, the display device may further include a pixel defining layer (shown as a white area in FIG. 1 or FIG. 2). The pixel defining layer may have openings for defining a region where the sub-pixels are located. The sub-pixels in the sub-pixel arrangement structure are in one-to-one correspondence to the openings in the pixel defining layer, with each sub-pixel located in the opening corresponding thereto.

Alternatively, the display device provided by this embodiment of the present disclosure may be a display panel, a mobile phone, a tablet computer, a television, a displayer, a notebook computer, a digital photo frame, a navigator, or any products or components that have a display function.

In the present application, "at least one" refers to one or more, and "a plurality of" refers to two or more. It should be noted that in the accompanying drawings, for clarity of the illustration, the dimension of some or all of the layers and regions may be scaled up. In the present disclosure, the terms "first", "second", "third" and "fourth" are for descriptive purposes only and are not to be construed as indicating or implying relative importance. The term "a plurality of" refers to two or more, unless otherwise specifically defined.

It should be noted that the embodiments of the sub-pixel arrangement structure, the embodiments of the method for manufacturing the sub-pixel arrangement structure, the embodiments of the mask device, the embodiments of the display devices and the embodiments of the display devices according to the embodiments of the present disclosure can be mutually referred to, which is not limited in the embodiments of the present disclosure. The steps in the embodiments of the method for manufacturing the sub-pixel arrangement structure according to the embodiments of the present disclosure may be added or deleted accordingly as required. Any variations to the method readily conceivable to any person skilled in the art in the technical scope disclosed by the present disclosure shall fall within the protection scope of the present disclosure. Therefore, a detailed description will not be repeated.

The foregoing descriptions are merely exemplary embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. A sub-pixel arrangement structure, comprising: a reference sub-pixel array, a plurality of third sub-pixels, and a plurality of fourth sub-pixels, wherein
the reference sub-pixel array comprises: first sub-pixels and second sub-pixels, both of which are arranged alternately in a first direction and a second direction;
in at least one of the first and second directions, one of the third sub-pixels is arranged between one of the first sub-pixels and one of the second sub-pixels adjacent to the one of the first sub-pixels, in the reference sub-pixel array; and
one of the fourth sub-pixels is arranged among four sub-pixels arranged in two rows and two columns in the reference sub-pixel array, the four sub-pixels comprise two of the first sub-pixels and two of the second sub-pixels; and a center of the one of the fourth sub-pixels is located between two rows of sub-pixels of the four sub-pixels arranged in two rows and two columns; and
wherein orthographic projections of the first and second sub-pixels on the substrate approximately have a shape of an octagon; orthographic projections of the third sub-pixels on the substrate approximately have a shape of a rectangle; and orthographic projections of the fourth sub-pixels on the substrate approximately have a shape of a hexagon;
wherein the octagon comprises two sides having an angle of less than 3 degrees with the first direction, and two sides having an angle of less than 3 degrees with the second direction; the rectangle comprises two sides having an angle of less than 3 degrees with the first direction, and two sides having an angle of less than 3 degrees with the second direction; and the hexagon comprises two sides having an angle of less than 3 degrees with the first direction; and
wherein the fourth sub-pixels and the first sub-pixels are alternately arranged in a third direction; the fourth sub-pixels and the second sub-pixels are arranged alternately in the third direction; and the third direction is intersected with both the first and second directions;
for each type of the first and second sub-pixels, a size of the sub-pixels in the second direction is larger than the size of the sub-pixels in the first direction; and the third sub-pixels are located between adjacent first and the second sub-pixels only in the first direction;
the third sub-pixels and the fourth sub-pixels are arranged alternately in the second direction; a size of the third sub-pixels is smaller than a size of the fourth sub-pixels in the first and second directions, and the size of the fourth sub-pixels is smaller than the size of the first and second sub-pixels in the second direction;
within a circumscribed rectangular area of the four sub-pixels arranged in two rows and two columns in the reference sub-pixel array, a number of the first sub-pixels, a number of the second sub-pixels, and a number of the third sub-pixels are all two times a number of the fourth sub-pixels; centers of the four sub-pixels arranged in two rows and two columns in the reference sub-pixel array are located at four vertexes of a rectangle, and centers of all the sub-pixels in the reference sub-pixel array are located at vertexes of a plurality of rectangles arranged in a checkerboard pattern;
a ratio of a maximum spacing to a minimum spacing between two opposite sides of any two adjacent sub-pixels ranges from 0.8 to 1.2;
either of the first and second sub-pixels has a color of red, and the other has a color of blue; and the color of the third sub-pixels is a first color, and the color of the fourth sub-pixels is green; the first color comprises any one of white, yellow and cyan; the sub-pixel arrangement structure is located on the substrate; and blue sub-pixels are sub-pixels which have the largest area of the orthographic projection on the substrate in the sub-pixel arrangement structure.

2. The sub-pixel arrangement structure according to claim 1, wherein the sub-pixel arrangement structure is located on a substrate; and orthographic projections of the sub-pixels in the sub-pixel arrangement structure on the substrate approximately have a shape of a polygon.

3. The sub-pixel arrangement structure according to claim 2, wherein the polygon is a rounded polygon.

4. The sub-pixel arrangement structure according to claim 1, wherein the orthographic projections of the third sub-pixels on the substrate approximately have a shape of a square.

5. The sub-pixel arrangement structure according to claim 1, wherein a ratio of spacing between any two adjacent sub-pixels in the sub-pixel arrangement structure to a target spacing ranges from 0.8 to 1.2.

6. The sub-pixel arrangement structure according to claim 1, wherein colors of the first, second, third and fourth sub-pixels comprise: red, blue, green, and the first color.

7. The sub-pixel arrangement structure according to claim 1, wherein the blue sub-pixels are present among the first, second, third and fourth sub-pixels.

8. A mask device for manufacturing the sub-pixel arrangement structure according to claim 1, wherein the subpixel arrangement structure comprises: first sub-pixels, second sub-pixels, third sub-pixels and fourth sub-pixels; and
the mask device comprises at least one mask plate, wherein the at least one mask plate has openings corresponding to the respective sub-pixels of the first, second, third and fourth sub-pixels, and the openings are adapted to manufacture sub-pixels corresponding to the openings.

9. The mask device according to claim 8, wherein the at least one mask plate comprises: four mask plates; the four mask plates are in one-to-one correspondence to the first sub-pixels, the second sub-pixels, the third sub-pixels, and the fourth sub-pixels; and each of the mask plates has openings corresponding to the sub-pixels.

10. A display device, comprising the sub-pixel arrangement structure according to claim 1.

11. A sub-pixel arrangement structure, comprising: a reference sub-pixel array, a plurality of third sub-pixels, and a plurality of fourth sub-pixels, wherein
the reference sub-pixel array comprises: first sub-pixels and second sub-pixels, both of which are arranged alternately in a first direction and a second direction;
in the first direction, one of the third sub-pixels is arranged between one of the first sub-pixels and one of the second sub-pixels adjacent to the one of the first sub-pixels, in the reference sub-pixel array; and
one of the fourth sub-pixels is arranged among four sub-pixels arranged in two rows and two columns in the reference sub-pixel array, the four sub-pixels comprise two of the first sub-pixels and two of the second sub-pixels; and a center of the one of the fourth sub-pixels is located between two rows of sub-pixels of the four sub-pixels arranged in two rows and two columns; and
wherein a first row comprises the first sub-pixels and second sub-pixels which are arranged alternately in the second direction without any other sub-pixels, a second row comprises the plurality of third sub-pixels and the plurality of fourth sub-pixels which are arranged alternately in the second direction without any other sub-pixels, the first row and the second row are alternately arranged in the first direction,
a number of sub-pixels in the first row is smaller than a number of sub-pixels in the second row, and a size in the second direction of the sub-pixels in the first row and the second row is larger than a size in the first direction of the sub-pixels in the first row and the second row; and
each of the sub-pixels is a polygon and has an edge parallel to an adjacent subpixel, and at least some of the subpixels have a different number of edges.

12. The sub-pixel arrangement structure according to claim 11, wherein the sub-pixel arrangement structure is located on a substrate, and orthographic projections of the sub-pixels in the sub-pixel arrangement structure on the substrate approximately have a shape of a polygon.

13. The sub-pixel arrangement structure according to claim 12, wherein the polygon is a rounded polygon.

14. The sub-pixel arrangement structure according to claim 11, wherein the orthographic projections of the third sub-pixels on the substrate approximately have a shape of a square.

15. The sub-pixel arrangement structure according to claim 11, wherein a ratio of spacing between any two adjacent sub-pixels in the sub-pixel arrangement structure to a target spacing ranges from 0.8 to 1.2.

16. The sub-pixel arrangement structure according to claim 11, wherein colors of the first, second, third and fourth sub-pixels comprise: red, blue, green, and the first color.

17. The sub-pixel arrangement structure according to claim 11, wherein the blue sub-pixels are present among the first, second, third and fourth sub-pixels.

18. A mask device for manufacturing the sub-pixel arrangement structure according to claim 11, wherein the subpixel arrangement structure comprises: first sub-pixels, second sub-pixels, third sub-pixels and fourth sub-pixels; and
the mask device comprises at least one mask plate, wherein the at least one mask plate has openings corresponding to the respective sub-pixels of the first, second, third and fourth sub-pixels, and the openings are adapted to manufacture sub-pixels corresponding to the openings.

19. A display device, comprising the sub-pixel arrangement structure according to claim 11, wherein the display device further comprises a pixel defining layer having openings, and an organic material is formed at the openings and covers a part of the pixel defining layer.

20. The display device according to claim 19, wherein shapes of the organic material in the openings are as same as shapes of the openings, and organic materials in adjacent sub-pixels are in contact with each other.

* * * * *

UNITED STATES PATENT AND TRADEMARK OFFICE
CERTIFICATE OF CORRECTION

PATENT NO. : 11,380,236 B2
APPLICATION NO. : 16/642425
DATED : July 5, 2022
INVENTOR(S) : Yuanqi Zhang et al.

Page 1 of 1

It is certified that error appears in the above-identified patent and that said Letters Patent is hereby corrected as shown below:

On the Title Page

Item (73) should read as follows:
(73) Assignees: Chengdu BOE Optoelectronics Technology Co., LTD., Sichuan (CN); BOE Technology Group Co., LTD., Beijing (CN)

Signed and Sealed this
Twenty-seventh Day of September, 2022

Katherine Kelly Vidal
*Director of the United States Patent and Trademark Office*